United States Patent
Potter et al.

(10) Patent No.: US 6,621,693 B1
(45) Date of Patent: Sep. 16, 2003

(54) LOW PROFILE, HIGH DENSITY STORAGE ARRAY

(75) Inventors: David Potter, Acton, MA (US); Jerry Jarvis, South Weymouth, MA (US); Robert Wiley, Topsfield, MA (US); Lawrence Genovesi, Scituate, MA (US)

(73) Assignee: Network Engines, Inc., Canton, MA (US)

( * ) Notice: Subject to any disclaimer, the term of this patent is extended or adjusted under 35 U.S.C. 154(b) by 0 days.

(21) Appl. No.: 09/899,760

(22) Filed: Jul. 5, 2001

Related U.S. Application Data (60) Provisional application No. 60/244,361, filed on Oct. 30, 2000, and provisional application No. 60/215,975, filed on Jul. 5, 2000.

(51) Int. Cl.⁷ ................................................ G06F 1/16
(52) U.S. Cl. ..................... 361/685; 361/687; 360/97.01; 364/708.1
(58) Field of Search ..................... 361/685, 680–684, 361/686–687, 724–727, 695, 697, 704, 707; 364/708.1; 360/97.01, 98.01

(56) References Cited

U.S. PATENT DOCUMENTS 5,640,302 A * 6/1997 Kikinis ........................ 361/687
6,122,163 A * 9/2000 Stone et al. ................. 361/685
6,392,884 B1 * 5/2002 Chou ........................... 361/687

\* cited by examiner

Primary Examiner—Darren Schuberg
Assistant Examiner—Hung Van Duong
(74) Attorney, Agent, or Firm—David J. Powsner; David D. Nielson; Nutter McClennen & Fish LLP (57) ABSTRACT

A low profile, high density storage array includes a digital data storage unit, such as a rack-mount chassis, and a plurality of digital data storage devices such as disk drives, disposed within the array. The drives are spaced apart from a floor of the array on which they are mounted, e.g., via supporting "sleds." In addition to facilitating insertion and removal of the drives from the array, air flow through or beneath these sleds cool the drives. The drives can be removably attached to the array via cam-like levers that facilitate mounting and dismounting of the drives from the chassis and its electrical circuitry.

35 Claims, 7 Drawing Sheets

LOW PROFILE, HIGH DENSITY STORAGE ARRAY

CROSS-REFERENCE TO RELATED APPLICATIONS

This application claims priority from U.S. provisional patent application Serial No. 60/244,361, filed Oct. 30, 2000, and Ser. No. 60/215,975, filed Jul. 5, 2000, both entitled "Low Profile, High Density Storage Array," both of which are incorporated herein by reference.

This application is related to the following co-pending, commonly assigned applications, the teachings of all of which are incorporated herein by reference: U.S. Ser. No. 60/215,952, filed Jul. 5, 2000, entitled "Server Architecture and Methods for Digital Data Processing," U.S. Ser. No. 60/216,055, filed Jul. 5, 2000, entitled "Low Profile Equipment Housing with Angular Fan," U.S. Ser. No. 60/215,997, filed Jul. 5, 2000, entitled "Ventilating Slide Rail Mount," U.S. Ser. No. 60/215,996, filed Jul. 5, 2000, entitled "Power Supply for Low Profile Equipment Housing," U.S. Ser. No. 60/215,995, filed Jul. 5, 2000, entitled "Circuit Board Riser," and U.S. Ser. No. 60/244,354, filed Oct. 30, 2000, entitled "Ventilating Slide Rail Mount."

BACKGROUND OF THE INVENTION

The present invention relates to storage devices and has particular application to high capacity, high performance, low profile storage arrays.

Heating is a constant and significant problem in digital data systems. The failure rates of many electronic components increase as operating temperatures rise. The problem is compounded by the use of ever more densely packed circuit boards, which increase local heating, and by more compact, lower profile devices which tend to restrict the airflow available for heat dissipation, e.g., for heat transfer cooling.

Most often, the components of digital data systems are cooled by airflow. Fans are typically used to push or pull air from one side of a chassis, across the enclosed components, and out the other side of the chassis. Thus, for example, the chassis of a typical digital data processor may include intake and/or exhaust fans, and may include additional fans on specific components or assemblies, such as power supplies, central processing units, and other heat-sensitive and heat-generating parts to further enhance cooling locally. While these solutions have proven adequate to date, there remains a need to provide for the cooling of even more powerful, more densely packed and/or more compact systems.

This need is particularly acute for web servers, network servers and other high capacity storage systems, in which a great number of essentially simultaneous data accesses and data transfers must be carried out with a data bank physically located at a specific and limited location, e.g., a computer room or a terminus or node of a broadband communications system. The hardware for these arrays typically comprise multiple disk drives, CDROM drives, or other magnetic, optical or optical-magnetic storage devices (e.g., hereinafter collectively referred to as "drives," "storage devices," "storage units," and so forth, except where otherwise evident from context) arranged in a single chassis, with multiple such chassis stacked in a single rack; to provide an array in which over one hundred drives occupy less than five or six square feet of floor space.

The chassis used in conventional high capacity storage systems are at least 3U, or 5½ inches, in height. Their depths and widths are selected, typically, for mounting in 19 inch equipment racks. In such configurations, twelve drives are mounted on their sides—like plates "stacked" side-by-side in a dishwasher. These 3U chassis, in turn, may be mounted in a stack ten or twelve high on a rack.

While useful in many applications, storage arrays that utilize 3U chassis do not meet the needs of all users who require high density storage capacity.

One object of the present invention is to provide an improved storage devices and, more particularly, improved storage arrays.

A more particular object is to provide such apparatus and methods as can be particularly adapted to web servers and other data processing apparatus that are compact of design and/or prone to overheating.

A still further object is to provide such apparatus and methods as can be implemented at low cost.

A still further object of the invention is to provide such apparatus and methods as can be adapted to pre-existing equipment, as well as designed for use in new equipment.

SUMMARY OF THE INVENTION

One or more of the foregoing objects are met by the present invention which provides, in one aspect, a low profile, high density storage array having a plurality of drives mounted "flat" (as opposed to on their "sides") within a chassis. The drives are spaced apart from a floor (or other wall) of the chassis on which they are mounted, so as to define a passage for cooling airflow. In accordance with one aspect of the invention, this spacing is provided by a support (e.g., legs, platform or a "sled") on which each drive is mounted that defines the airflow passage and that facilitates insertion and removal of the drive from the chassis.

In another embodiment, a storage array as described above comprises a plurality (e.g., eight or more) of drives each mounted on a respective support that, in turn, is disposed on a floor of the chassis. The support elements and/or respective drives are removably coupled to the chassis.

Coupling is provided, according to further aspects of the invention, by a cam-like levers which facilitate pushing the drives into and/or pulling them from physical and electrical engagement with the array and its electrical circuits (e.g., buses). Pairs of these levers can be provided for each drive, allowing the drive to be easily jockeyed into or out of engagement with the chassis and its electrical connectors without pin damage, despite the otherwise limited room for movement in a densely packed 1U chassis.

In yet another embodiment, the drives are removably attached to the support elements.

These and other aspects of the invention are evident in the drawings and in the discussion that follows.

BRIEF DESCRIPTION OF THE DRAWINGS

The invention will be more fully understood from the following detailed description taken in conjunction with the accompanying drawings, in which.

DETAILED DESCRIPTION OF THE DRAWINGS

Figure 1:
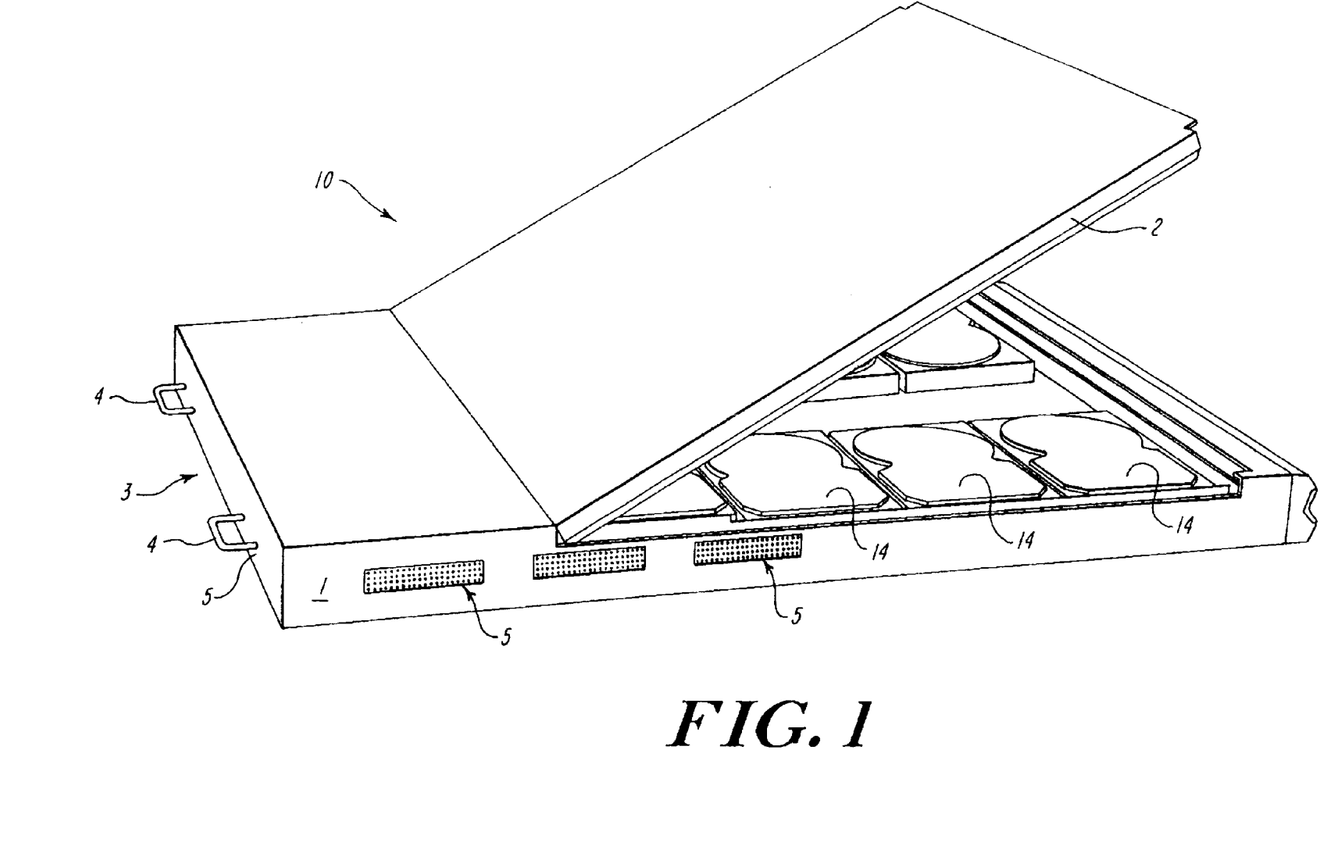
FIG. 1 depicts a data storage array in accordance with the present invention.
Figure 2:
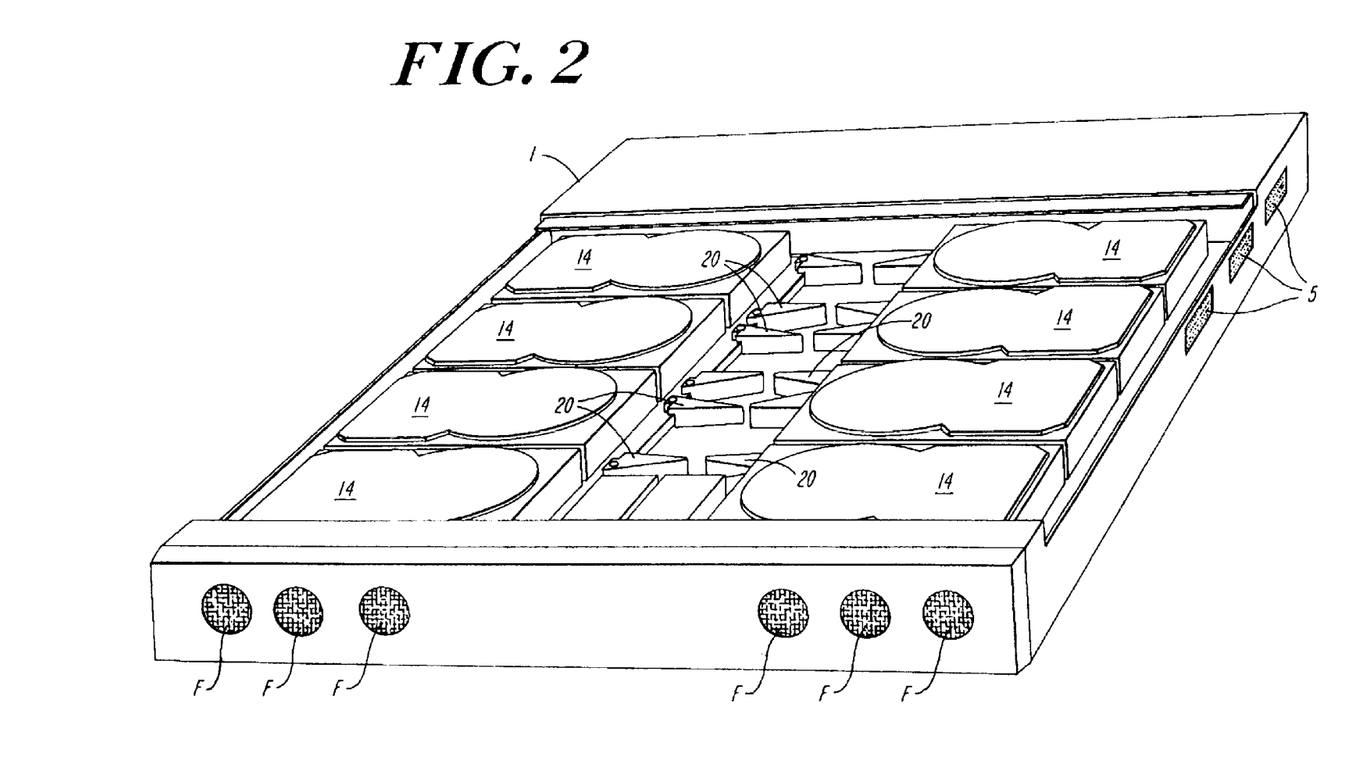
FIG. 2 is a perspective view of the data storage array of FIG. 1.

FIGS. 1 and 2 illustrate a storage array 10 in accordance with the present invention. In this embodiment, a chassis 1 having a cover 2 houses a plurality of plurality disk drives 14 (and/or other "drives," as defined above) in a closely packed array that is configured to mount in a rack with a plurality of other similar chassis that contain similar or related devices. The illustrated chassis is 1U in height and sized to fit in a conventional 19-inch equipment rack, though it will be appreciated that the teachings herein may be applied for use with chassis of other sizes.

With specific reference to FIG. 1, the array 10 includes handles 4 mounted on that face for manipulation of the chassis. It also includes various external adapters, jacks and/or other connectors that facilitate placing the array in electrical communication with other devices (e.g., processor modules) with which it operates. A cover 2 is provided on the chassis top and mounted via a hinge disposed midway along the top, as illustrated, so that the drives 14 and circuitry may be serviced.

In the discussion that follows, it will be appreciated that the applicant contemplates storage array chassis and drives that have a minor dimension (e.g., height or z-axis dimension) substantially smaller than either of their two cross-dimensions (e.g., width and depth, or x-axis and y-axis dimension), and intuitively these may be characterized as broad, flat and of low height, or as being generally pizza box-like in shape. In the embodiments illustrated herein, the drives are mounted "horizontally" in the chassis, with the height or z-axis dimension generally disposed transverse to a general direction of cooling airflow within a chassis. The two other, or major dimensions, are generally at least several times larger than the minor dimension and, therefore, present a surface having a substantial area which in accordance with the present invention is oriented parallel to a floor (or other wall) of the chassis in which the drives are mounted.

FIG. 2 illustrates the storage array 10 of FIG. 1 in a front perspective view from above, with the cover plate 2 removed. As shown, the chassis has six intake fans F located in its front face positioned to direct air generally from the front toward the back of the device over the components 14 mounted therein. Various louvers or apertures 5 are visible at different positions for allowing ingress or egress of the cooling air from the chassis, and for generally establishing a front-to-back airflow for maintaining temperature of the operating elements housed in the chassis at an appropriate level.

As further seen in FIG. 2, each drive 14 is associated with a pair of levers 20, of generally cam-like shape or action, that facilitate placement and, still more significantly, removal of the respective drive from the chassis 1. In the illustrated embodiment, the storage units 14 are mounted in an array extending down each side of chassis 1, with the levers 20 disposed in a central alley running down the length of a floor or base upon which the drives are mounted. Those skilled in the art will appreciate that, in alternate embodiments, the levers 20 may be mounted along the sides and the drives positioned more toward the central alley.

As shown in FIG. 2, the storage units 14 cover a substantial portion of the area of the floor of the chassis 1, as well as occupying a substantial portion of its height, so that airflow induced by the fans F on the face of one end of the chassis is relatively obstructed along both sides of the chassis, but somewhat more open down the central alley. This air flow obstruction poses a risk of air stagnation and heat build-up.

Figure 3:
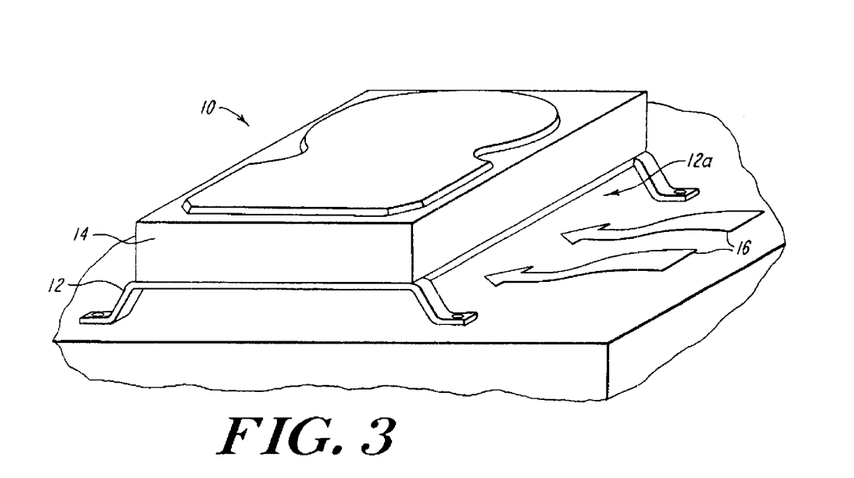
FIG. 3 depicts a support utilized in the embodiment of FIGS. 1–2 and illustrates air flow past a drive used therein.

In accordance with the embodiment of FIG. 3, this situation is addressed by mounting each drive 14 on a respective support 12 in order to space the drive apart from an adjacent wall, illustratively the floor, of the chassis 1 and thus provide a space for cooling airflow between the drive and the chassis. The support member 12 may be a wire-like, as shown in FIG. 3, with legs, posts or rails that snap in suitable mounting clips on the motherboard or chassis, or fit in a mounting mechanism such as simple apertures in the underlying board, or into clips or other suitable hold down mechanism.

As shown in the figure, airflow 16 passing along the edge of the storage assembly 14 passes into the channel 12a defined by this support 12 below the storage device 14. Airflow 16 may similarly be diverted into the space above the storage unit 14. As will be appreciated by those skilled in the art, a storage unit such as a disk drive is generally mounted on a circuit board and typically includes a motor or other circuit elements, so that the airflow 16 below the storage unit cools the underside of the circuit board and would, for example, directly contact the electrical components, or the soldered wires and lands coupled to those components.

Figure 4A:
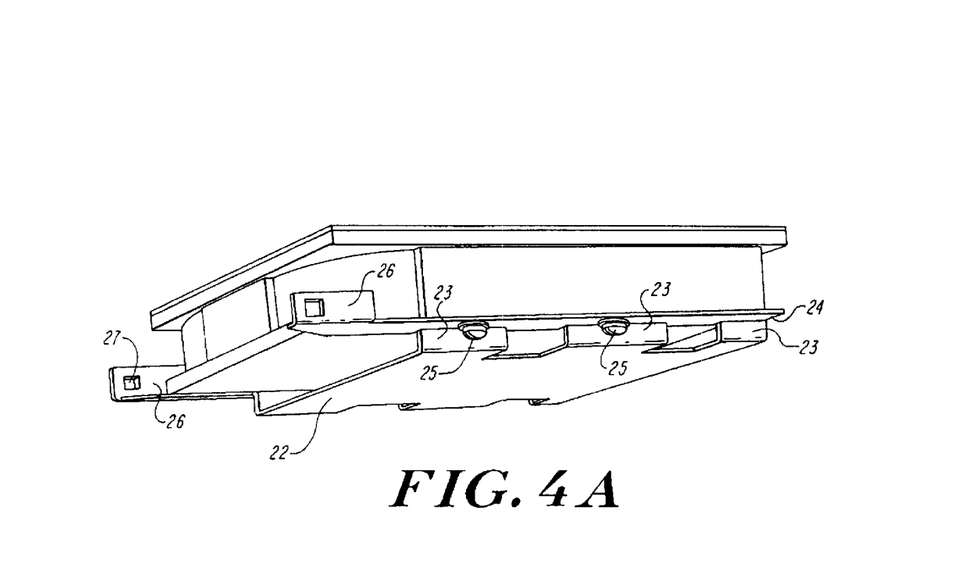
FIGS. 4A and 4B depicts support utilized in accordance with another embodiment of the invention.

FIG. 4A illustrates another embodiment of the invention in which a storage unit 14 is mounted on a support member 22 formed of a sheet metal stamping having a relatively broad floor substantially the size of the storage unit 14, with sidewalls or riser 23 approximately ¼ inch tall rising to side flanges 24 which attach at edges of the storage unit 14 by mounting bolts 25. The support 22 thus forms a sled which, as illustrated, mounts below the storage unit 14 forming a rectangular open air channel approximately ¼ inch high thereunder. The illustrated support unit 22 also includes projecting arms 26 at one end thereof, each arm 26 including an aperture 27, which is discussed further below.

Figure 4B:
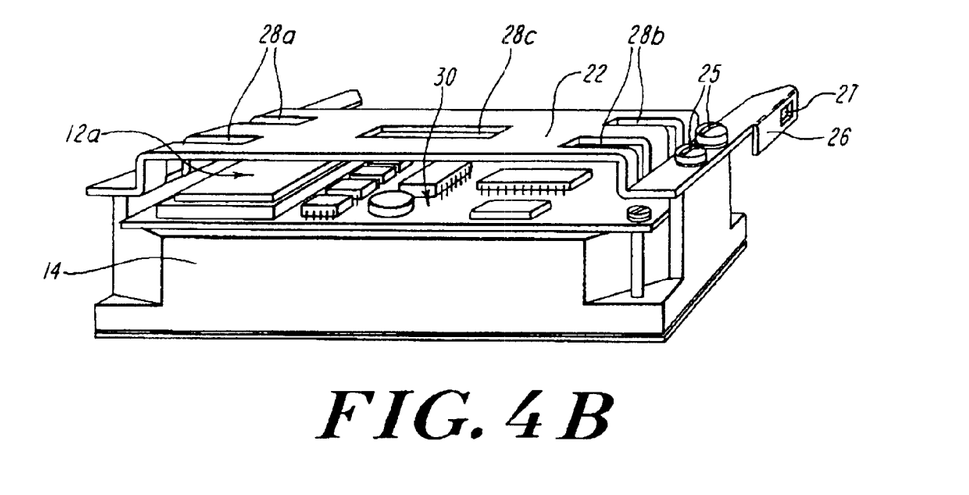

FIG. 4B illustrates the memory unit 14 and support 22 of FIG. 4A in a perspective view from the rear, with the device held upside down to show the support 22 more clearly. As shown in that figure, the read/write/control circuitry 30 for the storage unit 14 is mounted on the disk drive unit below its lower surface, with various circuit elements and chips projecting downwardly therefrom. The components thus reside directly in the auxiliary air space 12a created between the support sled 22 and the bottom of the disk drive 14. In the body of the support 22 itself various further opening 28a, 28b, 28c are visible, as best seen in FIG. 5, with the openings 28a, 28b being located towards the edges of the support sled and the opening 28c being centrally placed.

Figure 5:
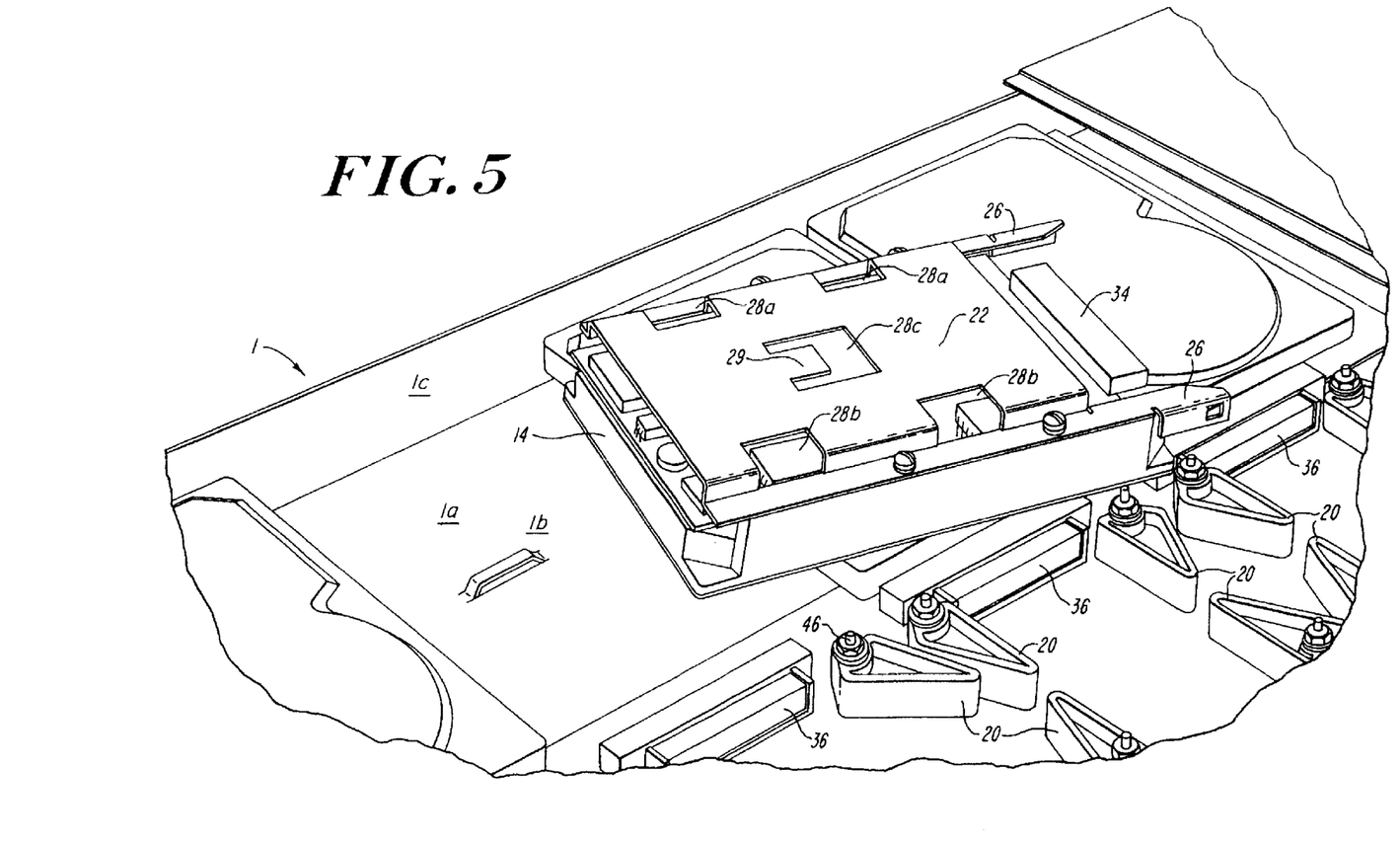
FIG. 5 shows further details of the support of FIGS. 4A and 4B.

FIG. 5 illustrates a disk drive storage unit 14 with the sled 22 attached lying next to its intended mounting position within the chassis 1. As shown in this embodiment, the chassis 1 has four bays on a side for receiving the storage units 14, and each mounting region or bay 1a has a centrally mounted bracket clip 1b formed therein. The chassis, it will be understood, may generally be formed of a suitable sheet metal such as a stamped and formed sheet iron or steel with folded over, side, end or other walls. The bracket clip 1b may simply be a stamped and indented feature forming a narrow strip of metal separated along it sides that extends several millimeters above the floor of the chassis to capture and receive a mating part on the sled.

As illustrated in FIG. 5, the sled has a corresponding finger member 29 that extends in a longitudinal direction (side-to-side as referenced to the front-back axis of the chassis, or end-to-end as referenced to the oblong shape of the storage unit 14). Finger 29 is positioned such that when the storage unit 14 is laid flat in its bay against the sidewall 1c of the chassis, and then moved toward the center of the chassis in a direct side-to-side movement, the finger 29 slides under the bracket 1b and secures the storage unit in the chassis 1.

As further shown in FIG. 5, the storage unit 14 has a multi-pin connector 34 through which power and data connections are made between the disk drive and a processor or bus circuit. Connector 34 in this embodiment is positioned at the same end as the arms 26 of the support 22.

According to another aspect of the present invention, the storage unit 14 is fixed in the chassis 1 by the cam-like lever members 20. In preferred embodiments, each member 20 is configured to grip the respective unit 14 for purposes of both mounting it on the chassis and bringing its connectors into electrical engagement with corresponding bus or other chassis circuitry, as well as for dismounting it from the chassis and that circuitry. Of course, those skilled in the art will appreciate that each member 20 can be configured differently, e.g., so as to facilitate only mounting or dismounting of the respective unit 14.

Figure 6:
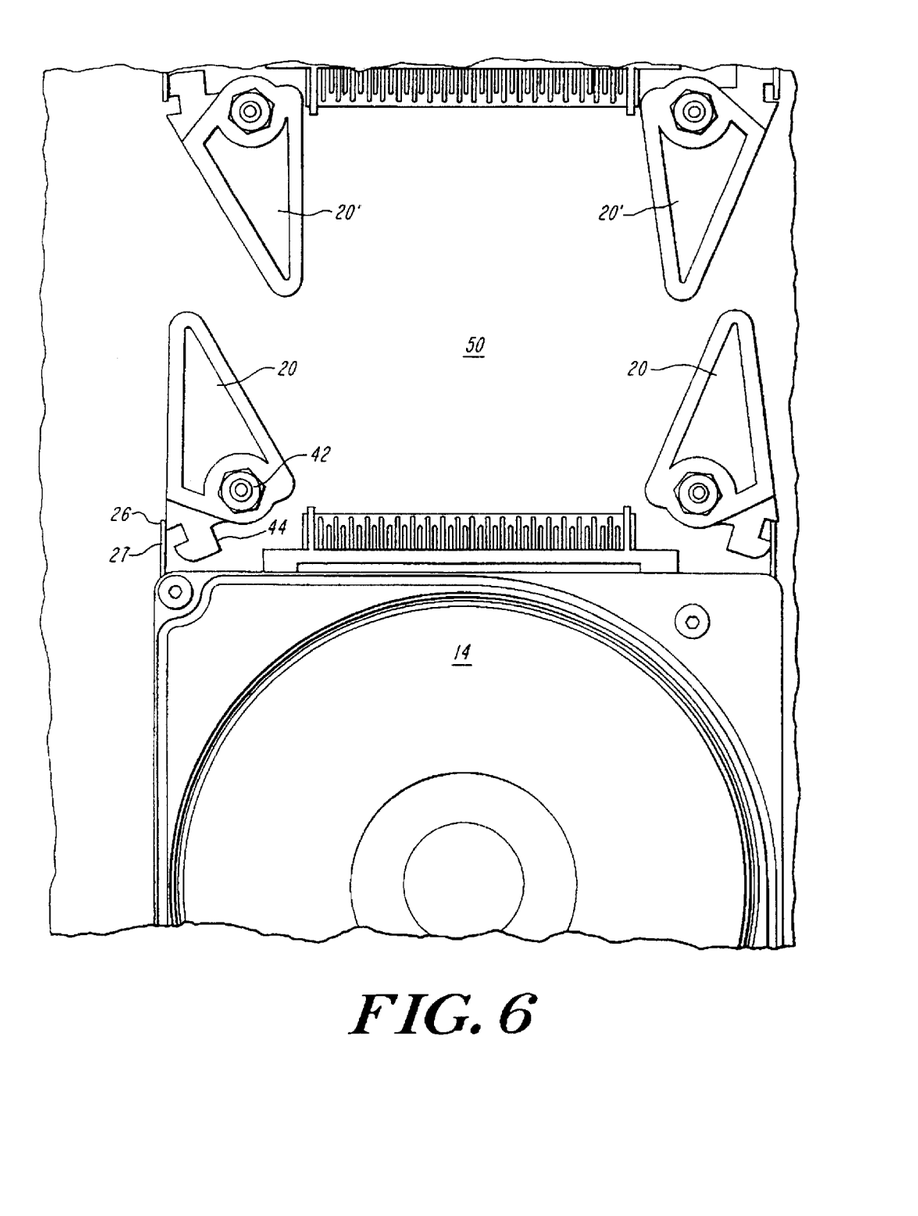
FIG. 6 shows positioning elements useful with the support of FIGS. 4A, 4B and 5 in a data storage unit in accordance with the present invention.

In the illustrated embodiment, each member 20 grips the respective unit 14 via aperture in the unit and pull the unit 14 centrally inward so that the connector 34 mates with a corresponding socket or plug connector 36 which is permanently mounted adjacent to the bay on the central bus or motherboard. FIG. 6 is an enlarged view illustrating this structure in more detail. As shown, each lever member 20 is mounted pivotally on a post 42 and has a general shape to provide clearance with respect to surrounding parts. The levers 20 have a height of under ½ inch and provide a good surface area for convenient gripping and movement, while not projecting substantially into or obstructing space above the surface of the central bus or motherboard 50.

Each lever 20 has a gripping pawl 44 positioned to extend into the aperture 27 of the arm 26 that extends outward from one end of the support 22. Thus, pivoting of the lever 20 about the post 42 in a clockwise direction pulls memory unit toward the central axis of the chassis 1. A second lever 20' grips the opposite arm 26 of the support 22 and counterclockwise rotation of this lever draws the other side of the storage unit inwardly toward the center. Similarly, rotation of the levers 20, 20' in the opposite direction pushes the storage unit 14 away from the center.

Since the levers 20, 20' are provided in pairs, one on each side of each storage unit, they may be rocked gently to move the storage unit such that its card edge, socket or end connector 34 is gently but firmly and accurately positioned in, or withdrawn from, the corresponding connector 36 on the central bus or board 50. Thus the mounting members 20 permit the boards to be manipulated and moved firmly against the connector with zero or little clearance on each side, and thus avoid the risk of applying excessive or destructive forces that often arose in prior art situations where inadequate clearance for hand gripping or suitable pressure contact would lead an installer to grip or press against more vulnerable portions of the device cover or assembly. In their locked position, the levers secure the unit 14. In lieu of an aperture 27 and pawl 44, the two components may have other forms of engaging structures, such as a hook and pin, a tooth and groove, a rack and gear, or the like.

As noted above, the support members position each storage unit offset from the floor of the chassis 1 so as to defining auxiliary cooling channels. This offset may be tailored to position the storage unit 14 and its connector at a desired vertical position for connecting to the board 50 or its connectors 36 along the sides.

Referring back to FIG. 1, once all the drives 14 are mounted utilizing the mechanisms discussed above, the top cover plate 2 may be closed and the entire unit mounted in a standard rack. The mounting structure is compact, allowing eight disk drive units to be packed in a 1U chassis, of which 25 to 30 such chassis may be mounted in a single rack to produce a web server storage array density of 200 to 240 disk drive units in the small footprint of a single rack. Thus, the enhanced airflow mounting features of the present invention provide a packing density that is essentially twice that achieved when mounting a dozen disk drive units vertically in a 3U rack mount chassis.

The support and mounting structures of the present invention provide compact, enhanced cross-section, arrangements, providing additional space within the chassis, with adequate ventilation for proper heat dissipation for the power supply, control processors and the illustrated storage devices in a compact unit. Various modifications of this construction may be employed to further produce more compact, lower profile devices for web or network servers, with various commonly-owned method and apparatus inventions developed by applicant to enhance heat dissipation or cooling mechanisms in densely arrayed web server equipment. These provide a range of architectures and constructions to which the structures, elements and arrangements of the present invention are advantageously applied.

Figure 7:
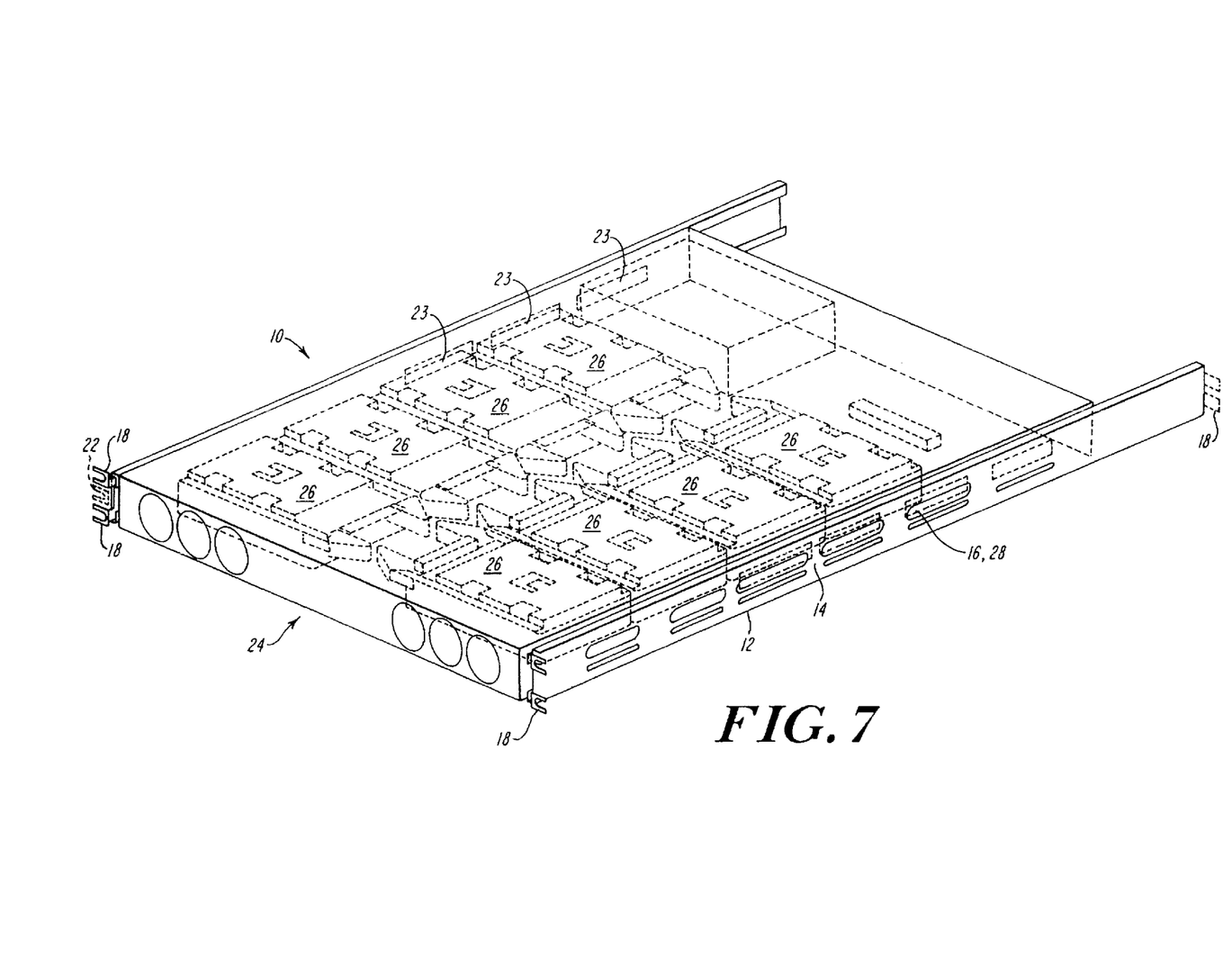
FIG. 7 depicts a ventilated chassis and slide-rail array assembly of the type amenable for use with a storage array according to the invention.

For example, co-pending, commonly assigned U.S. patent application Ser. No. 60/215,997 filed Jul. 5, 2000, entitled "Ventilating Slide Rail Mount" and co-pending, commonly assigned U.S. patent application Ser. No. 60/244,354 filed Oct. 30, 2000, also entitled "Ventilating Slide Rail Mount" disclose a ventilated slide-rail assembly which facilitate the flow of air throughout a ventilated chassis. Such a chassis, including lever members and other structures for use in a storage array of the type described above, is depicted in FIG. 7. A more complete understanding of that chassis may be attained by reference to the aforementioned applications, the teachings of which are incorporated herein by reference.

By way of further example, the teachings hereof may be combined with those of co-pending, commonly U.S. patent application Ser. No. 60/216,055 filed Jul. 5, 2000, entitled "Low Profile Equipment Housing with Angular Fan," which provides an angled fan disposed within a chassis for integrating the region around a component into the airflow pattern; commonly assigned, co-pending U.S. patent application Ser. No. 60/215,996 filed Jul. 5, 2000, titled "Power Supply for Low Profile Equipment Housing," which discloses a power interconnect for data handling and storage devices providing additional airflow space or compact fixed interconnecting structure; and/or U.S. patent application Ser. No. 60/215,995 filed Jul. 5, 2000, titled "Circuit Board Riser" which discloses a circuit board riser which among other attributes, occupies less space, thereby providing additional space for airflow to travel. Another commonly owned U.S. patent application, Ser. No. 60/215,952, filed Jul. 5, 2000, entitled "Server Architecture and Methods for Digital Data Processing," describes a unique architecture for server systems and the monitoring of physical or utilization status. Each of the foregoing constructions is advantageously employed in a system of the present invention and the support and mounting structure for arrayed devices discussed herein further provides additional open space within the chassis, allowing for effective cooling of densely packed or arrayed components, and more compact systems, and is compatible with, or extends each of the above inventions, the patent applications of which are all hereby incorporated by reference.

One skilled in the art will appreciate further features and advantages of the invention based on the above-described embodiments. By way of example, it will be appreciated that the measurements and other dimensions enumerated above are merely examples of those with which may be practiced. It will also be appreciated that the teachings herein can be applied to storage arrays in which drives, arranged as shown generally in the drawings, are stacked one on top of another, with sleds or other support members ensuring necessary spacing for adequate cooling airflow. Accordingly, the invention is not to be limited by what has been particularly shown and described, except as indicated by the appended claims. All publications and references cited herein are expressly incorporated herein by reference in their entirety. In view of the foregoing, what is claimed is:

What is claimed is:

1. A digital data storage array comprising:
   a chassis defining an enclosure,
   a plurality of digital data storage devices disposed within the chassis and removably mounted to a wall thereof,
   the chassis and each of the digital data storage devices having three principal axis, x, y, and z, with dimensions along those axis defining a width, depth, and height, respectively, the height of the chassis and each of the digital storage devices being less than the depth and the width of the chassis and that digital storage device, respectively,
   the digital data storage devices being arranged such that their respective z axes are oriented substantially parallel to the z axis of the chassis, and
   the digital data storage devices being disposed offset from the chassis wall to which they are removably mounted forming a channel between the digital data storage devices and the chassis wall, that channel facilitating a flow of air about the devices.

2. The digital data storage array according to claim 1, wherein the chassis is substantially 1U in height.

3. The digital data storage array according to claim 1, wherein the wall is a floor of the chassis.

4. The digital data storage array according to claim 1, comprising a fastening element for facilitating any of insertion and removal of each of the digital data storage device from the array.

5. The digital data storage array according to claim 1, wherein the chassis includes a hinged top for facilitating access to the digital data storage devices.

6. A digital data storage array comprising:
   a chassis defining an enclosure having a height of substantially 1U,
   at least one digital data storage device disposed within the chassis and removably mounted to a wall thereof,
   the chassis and the digital data storage device each having three principal axis, x, y, and z, with dimensions along those axis defining a width, depth, and height, respectively, the height of each of the chassis and the digital storage device being less than each of the depth and the width of the chassis and digital storage device, respectively,
   the digital data storage device being arranged such that its z axis is oriented substantially parallel to the z axis of the chassis, and
   the digital data storage device being disposed a distance from the chassis wall to which it is removably mounted forming a channel between the digital data storage device and the chassis wall, the channel facilitating a flow of air about the devices.

7. The digital data storage array according to claim 6, wherein the wall is a floor of the chassis.

8. The digital data storage array according to claim 6, comprising a fastening element for facilitating any of insertion and removal of the digital data storage device from the array.

9. The digital data storage array according to claim 6, comprising a pair of fastening elements for facilitating any of insertion and removal of the digital data storage device from the array.

10. The digital data storage array according to any of claims 7–9, comprising a plurality of said digital data storage devices, each associated with at least one of the fastening elements.

11. The digital data storage array of claim 6, wherein the at least one digital data storage device is disposed on a platform that is, itself, removably mounted to the aforementioned chassis wall.

12. The digital data storage array of claim 11, wherein the at least one digital data storage device is removably attached to the platform.

13. The digital data storage array of claim 11, wherein the platform comprises a planar surface having at least one leg extending perpendicularly therefrom.

14. A digital data storage system, comprising:
    a chassis having a bottom surface, and side walls, the side walls being 1U in height; and
    a digital data storage device disposed within the chassis a distance above the bottom surface of the chassis forming a channel between the digital data storage device and the bottom surface of the chassis, the channel facilitating a flow of air, the digital data storage device being longer in one dimension than the other two dimensions, the longest dimension of the device being aligned with the bottom surface of the chassis.

15. The digital data storage array of claim 14, further comprising at least one platform for supporting the at least one digital data storage device a distance above the bottom surface of the chassis.

16. The digital data storage array of claim 15, wherein the at least one digital data storage device is are removably attached to the at least one platform.

17. The digital data storage array of claim 15, further comprising a fastening element for removably attaching the at least one digital data storage device to the at least one platform.

18. The digital data storage array of claim 15, wherein the platform is removably attached to the chassis.

19. The digital data storage array of claim 15, wherein the platform comprises a planar surface having at least one leg extending perpendicularly therefrom.

20. A digital data storage system, comprising:

a chassis having a bottom surface; and a plurality of generally planar digital data storage device disposed within the chassis at a distance above the bottom surface of the chassis such that an airflow path is defined between the bottom surface of the chassis and the digital data storage devices, the digital data storage devices being substantially co-planar with the bottom surface of the chassis.

21. The digital data storage array of claim 20, wherein the digital data storage devices have a depth, a width, and a height, the devices being disposed within the chassis such that the height of the devices is less than the height of the chassis.

22. The digital data storage array of claim 20, further comprising a plurality of platforms for supporting the digital data storage devices a distance above the bottom surface of the chassis.

23. The digital data storage array of claim 22, wherein the digital data storage devices are removably attached to the platforms.

24. The digital data storage.array of claim 22, further comprising a fastening element for removably attaching the digital data storage devices to the platforms.

25. The digital data storage array of claim 22, wherein the platforms are removably attached to the chassis.

26. The digital data storage array of claim 22, wherein the platforms comprises a planar surface having at least one leg extending perpendicularly therefrom.

27. A low profile, high density storage array, comprising:

a chassis;

a plurality of generally planar digital data storage devices disposed within the chassis; and a plurality of support elements for supporting the digital data storage devices apart from and substantially co-planer with the chassis;

wherein the support elements define an airflow path between the digital data storage devices and the chassis, wherein cooling air in the airflow path contacts a bottom face of the digital data storage devices.

28. The low profile, high density storage array of claim 27, wherein the support element comprises a platform.

29. The low profile, high density storage array of claim 27, wherein the digital data storage devices are removably attached to the support elements.

30. The low profile, high density storage array of claim 27, wherein the support elements are removably attached to the chassis.

31. A digital data storage unit, comprising:

a chassis;

at least one support element disposed within the chassis; and at least one generally planar digital data storage device attached to the support element;

wherein the at least one support element supports the at least one digital data storage device a distance from the chassis forming a channel therebetween, the channel facilitating a flow of cooling air that removes heat from an underside of the digital data storage device; and wherein the digital data storage device lies in substantially the same plane as the chassis.

32. The digital data storage unit of claim 31, wherein the support element defines an airflow space between the digital data storage device and the chassis.

33. The low profile, high density storage array of claim 31, wherein the support element comprises a platform.

34. The low profile, high density storage array of claim 31, wherein the digital data storage devices are removably attached to the support elements.

35. The low profile, high density storage array of claim 31, wherein the support elements are removably attached to the chassis.

* * * * *